United States Patent
Kawashima

Patent Number: 5,334,578
Date of Patent: Aug. 2, 1994

[54] METHOD OF MANUFACTURING SUPERCONDUCTOR

[75] Inventor: Maumi Kawashima, Osaka, Japan

[73] Assignee: Sumitomo Electric Industries, Ltd., Osaka, Japan

[21] Appl. No.: 221,080

[22] Filed: Jul. 19, 1988

[30] Foreign Application Priority Data

Jul. 21, 1987 [JP] Japan ................ 62-182928

[51] Int. Cl.$^5$ ............................. H01L 39/12
[52] U.S. Cl. ..................... 505/400; 264/22; 264/24; 505/727; 505/739; 505/490
[58] Field of Search ............ 264/22, 24; 505/1, 727, 505/739

[56] References Cited

U.S. PATENT DOCUMENTS 4,975,411 12/1990 Danby .................... 264/24

OTHER PUBLICATIONS

Farrell, D. E., et al, Superconducting Properties of Aligned Crystalline Grains of $Y_1Ba_2C_{43}O_{7-8}$ in Physical Review B—Sep. 1987, The American Chemical Society.

Brodsky et al, High-Temperature Superconductors, Symposium held Nov. 30–Dec. 4, 1987, Boston, Mass., Materials Research Society vol. 99.

Primary Examiner—James Derrington
Attorney, Agent, or Firm—Pennie & Edmonds

[57] ABSTRACT

According to this method of manufacturing a superconductor, powder materials of $Y_2O_3$, $BaCO_3$ and $CuO$ are first prepared as raw materials and blended and mixed to the composition $Y_1Ba_2Cu_3O_x$. The mixed powder thus obtained is compression-molded and thereafter sintered. A sintered body thus obtained shows the Meissner effect under the temperature of liquid nitrogen. This sintered body is pulverized into fine particles. A magnetic field is applied to the fine particles at the temperature of liquid nitrogen, thereby to select only superconductive particles. The selected superconductive particles are compression-molded during application of a magnetic field and then sintered, thereby to obtain a superconductor having high critical current density.

4 Claims, 1 Drawing Sheet

METHOD OF MANUFACTURING SUPERCONDUCTOR

BACKGROUND OF THE INVENTION

1. Field of the Invention

The present invention relates to a method of manufacturing a superconductor having anisotropic conductivity, and more particularly, it relates to a method of manufacturing a superconductor, which can improve its critical current density.

2. Description of the Prior Art

In the case of a superconductor consisting of an alloy or an intermetallic compound, its superconductivity is not influenced by azimuths of crystal axes, i.e., is isotropic. Therefore, it is not necessary to consider the azimuths of the crystal axes but the superconductor can be manufactured by various methods such as a powder sintering method, a melting method and a sputtering method, depending on its use.

In the case of a ceramic superconductor which is mainly manufactured by the powder sintering method or the like, however, its superconductivity varies with the azimuth of the crystal grains forming the same, to have anisotropic conductivity. Thus, it has been recognized that current density of a superconductor cannot be effectively improved unless the same is so manufactured as to orient its crystal axes in a constant direction.

As hereinabove described, a ceramic superconductor of a polycrystalline substance manufactured by a conventional method such as the powder sintering method or the melting method is anisotropic with respect to superconductivity, if the crystal axes thereof are not oriented in a constant direction. When a current is fed to such a ceramic superconductor of a polycrystalline substance, for example, loss is caused by anisotropy between crystals, to prevent flow of a large current. Therefore, such a superconductor is manufactured by performing heat treatment for monocrystallizing the same, or by growing a thin film the crystal axes of which are oriented in a constant direction, to improve the current density of the superconductor. In such a method, however, much labor is required in order to manufacture superconductor materials of high volume of in bulk.

A superconductor manufactured by the melting method or the powder sintering method generally consists of a polycrystalline substance, the crystals of which are randomly arranged. Therefore, heat treatment is repeated on the polycrystalline substance to orient its crystal axes in a constant direction or temperature treatment is performed with a temperature gradient, thereby to bring the entire polycrystalline substance into a completely superconducting state. However, the degree of superconductivity of such products varies, and hence much time and labor are required in order to manufacture uniform superconductors.

SUMMARY OF THE INVENTION

Accordingly, the present invention has been proposed to solve the aforementioned problems, and an object thereof is to provide a simple method of manufacturing a superconductor suitable for mass production, which can obtain a superconductor having high critical current density although of anisotropic superconductive characteristics.

Provided according to the present invention is a method of manufacturing a superconductor having anisotropic conducting axes, which comprises:

(a) a step of blending, mixing and solidifying raw materials for a superconductive material so that a solid body is obtained which is at least partially superconductive;

(b) a step of pulverizing the solid body thus solidified into fine particles;

(c) a step of applying a magnetic field to the fine particles at a temperature below the critical temperature, thereby to select superconductive particles; and (d) a step of compression-molding the superconductive particles thus selected while applying a magnetic field and sintering the same.

In the manufacturing method according to the present invention, a solid body is first manufactured to be at least partially superconductive. This solid body consists of a polycrystalline substance having randomly oriented crystals. The solid body is pulverized into fine particles, which are then exposed to a magnetic field at a temperature below the critical temperature, for selection. At this time, the superconductive particles are subjected to strong repulsive force in the magnetic field because of the Meissner effect, which is one of the basic properties of superconduction. Consequently, only the superconductive particles move in the magnetic field, and can thus be selected from non-superconductive particles. The superconductive particles thus selected are subjected to compression-molding during application of a magnetic field and sintered, so that the same are solidified with their crystal axes oriented in a constant direction. A superconductor thus obtained in the form of an aggregate of crystal grains, having conducting axes oriented in a constant direction, is excellent in superconductivity and has particularly high critical current density.

In this manufacturing method, the step of mixing and solidifying the raw materials so that the solid body thus obtained is at least partially superconductive may be performed by the powder sintering method of compression-molding powder obtained by stoichiometrically blending raw materials of elements and compounds, press-working, sintering and solidifying the same, or by the melting and mixing the raw materials and thereafter solidifying the same.

If the solid body solidified in the aforementioned manner is pulverized into the fine particles of up to about several $\mu m$ in particle size, most of the particles are in the form of monocrystal grains regardless of crystal grain size. When the particles are subjected to compression-molding with application of a magnetic field after selection, crystal axes of most of the crystal grains are oriented. Thus, the solid body to be subjected to selection of superconductive particles is preferably pulverized into the finest possible particles of 1 to 10 $\mu m$ in particle size.

The present invention is directed to a superconductor of a ceramic compound such as Y-Sr-Cu-O, Ba-Y-Cu-O, La-Sr-Cu-O or La-Ba-Cu-o. However, the method according to the present invention is not restricted to manufacturing of such a ceramic superconductor, but includes any superconductor having anisotropic conducting axes which may be developed in the future.

These and other objects, features, aspects and advantages of the present invention will become more apparent from the following detailed description of the present invention when taken in conjunction with the accompanying drawing.

DESCRIPTION OF THE PREFERRED EMBODIMENT

Figure 1:
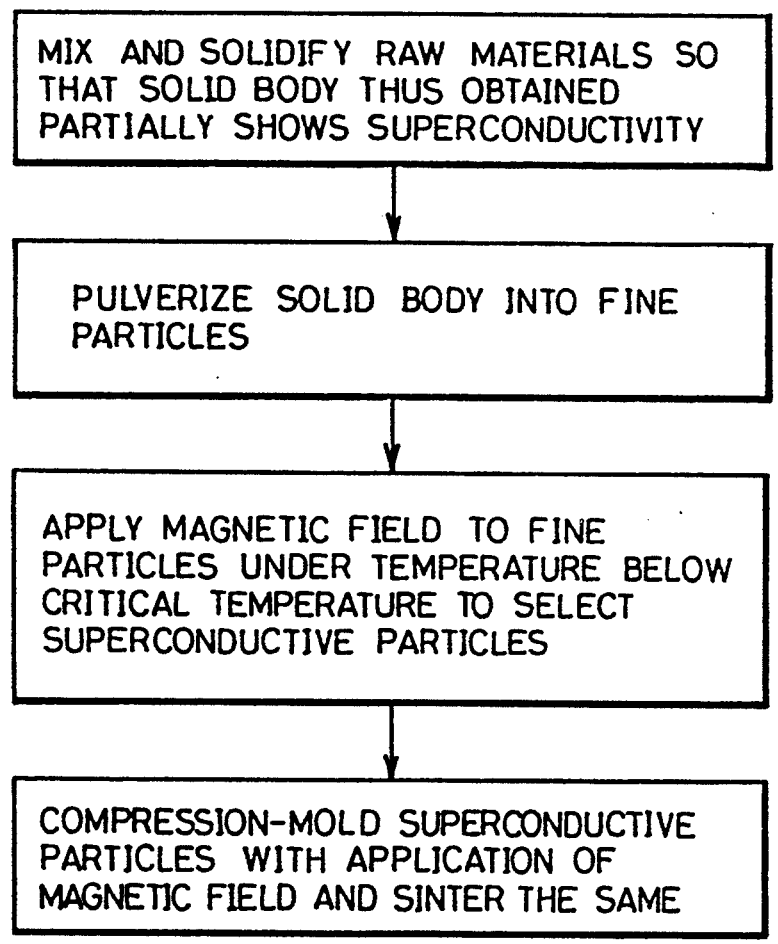
FIG. 1 is a process drawing schematically showing the steps in manufacturing a superconductor according to the present invention.

A method of manufacturing a superconductor according to the present invention is carried out schematically along the steps as shown in FIG. 1.

Description is now provided of an Example of the present invention.

First, powder materials of $Y_2O_3$, $BaCO_3$ and CuO were prepared as raw materials for a Y-Ba-Cu-O oxide superconductor. These powder materials were respectively weighed to satisfy composition of $Y_1Ba_2Cu_3O_x$, and thereafter thoroughly mixed with each other. Then mixed powder thus obtained was press-worked under pressure of 1 ton/cm$^2$, to be shaped into a prescribed configuration through compression-molding. A molded substance thus obtained was sintered at a temperature of 920° C. for 12 hours. A sintered body thus produced was cooled to the room temperature. Examination was made of the superconductivity of this sintered body, which showed the Meissner effect at a temperature of 77 K.

Then the sintered body was introduced into a ball mill, to be pulverized into fine particles of 3 to 10 μm in particle size. The fine particles were cooled to the temperature of liquid nitrogen of 77 K, to be introduced on a circular magnet having magnetic flux density of about 2000 G. Only particles repulsively moved by the Meissner effect were collected by a magnetic field provided around the magnet, while other particles were removed. The superconductive particles were thus separated from the non-superconductive particles. In such case, the magnetic field to be applied to the fine particles preferably has magnetic flux density of 100 to 3000 G. If the magnetic flux density is not more than 100 G, the repulsive force of the particles caused by the Meissner effect is insufficient. On the other hand, if the magnetic flux density exceeds 3000 g, the magnetic flux infiltrates into the particles, and the Meissner effect gradually decreases.

The superconductive particles collected in the aforementioned manner were again compression-molded by press working, to be sintered at a temperature of 950° C. for 12 hours. In this case, compression-molding was performed while applying a magnetic field having magnetic flux density of about $10^4$ G in a direction identical to that of pressurization. The magnetic field to be thus applied preferably has magnetic flux density of $10^4$ to $2 \times 10^4$ G.

Crystal axes of respective crystal grains were well-oriented in a sintered body thus finally obtained, while its critical current density $J_C$ at a temperature of 77 K and magnetic flux density of 0 T (tesla) was 1200 A/cm$^2$, which value was higher than the critical current density $J_C$ of 800 A.cm$^2$ if the body measured before to the aforementioned pulverizing step.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a superconductor of composition $Y_1Ba_2Cu_3O_x$ with a critical current density $J_C$ at a temperature of 77k and magnetic flux density of 0 T (tesla) of about 1200 A/cm$_2$, said superconductor having anisotropic conducing axes, comprising the steps of:

blending, mixing and solidifying raw materials for a superconductor of composition $Y_1Ba_2Cu_3O_x$ with a critical current density $J_C$ at a temperature of 77k and magnetic flux density of 0 T (tesla) of about 1200 A/cm$_2$, so that a solid body thus obtained at least partially shows superconductivity at a temperature less than a critical temperature;

pulverizing said body into the fine particles;

applying a magnetic field to said fine particles at a temperature below the critical temperature, and selecting superconductive particles; and compression molding said superconductive particles thus selected while applying a magnetic field, and sintering the same.

2. A method of manufacturing a superconductor in accordance with claim 1, wherein said step of compression-molding and sintering said superconductive particles includes compression-molding of said superconductive particles with application of a magnetic field in a direction identical to that of pressurization for said compression-molding.

3. A method of manufacturing a superconductor in according with claim 1, wherein said step of mixing and solidifying said raw materials includes performance of a sintering step.

4. A method of manufacturing a superconductor in accordance with claim 1, wherein said step of mixing and solidifying said raw materials includes performance of a melting step.

* * * * *